(12) United States Patent
Volkov et al.

(10) Patent No.: US 11,442,644 B2
(45) Date of Patent: Sep. 13, 2022

(54) SYSTEMS AND METHODS FOR OPTIMIZED RE-STRIPING IN AN ERASURE ENCODED STORAGE

(71) Applicant: Acronis International GmbH, Schaffhausen (CH)

(72) Inventors: Oleg Volkov, Moscow (RU); Andrey Zaitsev, Moscow (RU); Alexey Kuznetsov, Moscow (RU); Yuri Per, Moscow (RU); Stanislav Protasov, Moscow (RU); Serguei Beloussov, Costa Del Sol (SG)

(73) Assignee: Acronis International GmbH, Schaffhausen (CH)

( * ) Notice: Subject to any disclaimer, the term of this patent is extended or adjusted under 35 U.S.C. 154(b) by 152 days.

(21) Appl. No.: 16/986,326

(22) Filed: Aug. 6, 2020

(65) Prior Publication Data
US 2021/0286538 A1     Sep. 16, 2021

Related U.S. Application Data (60) Provisional application No. 62/987,908, filed on Mar. 11, 2020.

(51) Int. Cl.
*G06F 3/06* (2006.01)
*H03M 13/15* (2006.01)

(52) U.S. Cl.
CPC ............ *G06F 3/0644* (2013.01); *G06F 3/064* (2013.01); *G06F 3/0619* (2013.01); *G06F 3/0629* (2013.01); *G06F 3/0679* (2013.01); *H03M 13/154* (2013.01)

(58) Field of Classification Search
CPC .... G06F 3/0644; G06F 3/0619; G06F 3/0629; G06F 3/064; G06F 3/0679; H03M 13/154
See application file for complete search history.

(56) References Cited

U.S. PATENT DOCUMENTS

| | | | |
|---|---|---|---|
| 10,114,581 B1 * | 10/2018 | Natanzon | G06F 3/065 |
| 2015/0067295 A1 * | 3/2015 | Storm | G06F 3/0644 711/171 |
| 2019/0294339 A1 * | 9/2019 | Bolkhovitin | G06F 3/0688 |
| 2020/0336157 A1 * | 10/2020 | Jensen | H03M 13/3761 |

* cited by examiner

*Primary Examiner* — Nanci N Wong
(74) *Attorney, Agent, or Firm* — ArentFox Schiff LLP; Michael Fainberg (57) ABSTRACT

Aspects of the present disclosure describe methods and systems for optimized re-striping in an erasure encoded storage. In one exemplary aspect, a method may receive a request to re-stripe a plurality of data blocks arranged as a tile in the erasure encoded storage, wherein the request comprises a desired tile width. The method may identify (1) a number of data blocks in the tile and (2) a width of the tile. The method may determine a maximum number of data blocks that do not need to be rearranged when reconfiguring the tile to the desired tile width. Furthermore, the method may determine a tile reconfiguration with the desired tile width that does not rearrange the maximum number of the data blocks of the tile, and may re-stripe the tile in accordance with the tile reconfiguration.

18 Claims, 6 Drawing Sheets

SYSTEMS AND METHODS FOR OPTIMIZED RE-STRIPING IN AN ERASURE ENCODED STORAGE

CROSS-REFERENCE TO RELATED APPLICATIONS

This application claims the benefit of U.S. Provisional Application No. 62/987,908, filed Mar. 11, 2020, which is herein incorporated by reference.

FIELD OF TECHNOLOGY

The present disclosure relates generally to the field of erasure encoding in data storage, more specifically, to systems and methods for optimizing re-striping in an erasure encoded storage.

BACKGROUND

Erasure encoding is a technique of forward error correction in which data is divided into blocks, expanded, encoded with redundant data pieces, and stored across a set of different locations. The goal of erasure encoding is to enable data that becomes corrupted in a given location to be reconstructed by using information about the data that is stored in a different location.

More specifically, erasure encoding involves creating a set of K checksum blocks with content related to a set of N data blocks (with all blocks having the same size). The checksum blocks content relate to the data blocks content via a set of K linear equations chosen such that the system of equations is not degenerate. This allows reconstruction of up to K missing blocks by means of solving the system of linear equations. Such an encoding scheme is usually labeled as N+K erasure encoding. A whole set of blocks is usually called a "stripe," while an individual data block or a checksum block is called a "strip." By placing different blocks onto different storage nodes, up to K node failures can be tolerated without losing the data.

Modern software-defined storage systems typically have the ability to increase their capacity be adding storage nodes to an existing installation. As the amount of stored data reaches installation capacity, users may accordingly add more storage nodes to increase capacity. By having more storage nodes available, the storage efficiency may be further improved by increasing the width of a stripe. Unfortunately, increasing the stripe width of existing data containers is a very resource expensive process. For example, a conventional approach involves copying the entire data container to another storage location with new encoding parameters.

SUMMARY

Thus, aspects of the disclosure describe methods and systems for optimized re-striping in an erasure encoded storage. In one exemplary aspect, a method may receive a request to re-stripe a plurality of data blocks arranged as a tile in the erasure encoded storage, wherein the request comprises a desired tile width. The method may identify (1) a number of data blocks in the tile and (2) a width of the tile. The method may determine a maximum number of data blocks that do not need to be rearranged when reconfiguring the tile to the desired tile width. Furthermore, the method may determine a tile reconfiguration with the desired tile width that does not rearrange the maximum number of the data blocks of the tile, and may re-stripe the tile in accordance with the tile reconfiguration.

In some aspects, determining the tile reconfiguration with the desired tile width that does not rearrange the maximum number of the data blocks of the tile further comprises calculating tile configurations for all possible tile widths that the number of data blocks is divisible by prior to re-striping the tile.

In some aspects, applying a CP transformation comprises determining a respective maximum number of data blocks that do not need to be rearranged when reconfiguring a given tile to a given tile width and determining a respective tile reconfiguration with the given tile width that does not rearrange the respective maximum number of the data blocks of the given tile.

In some aspects, calculating the tile configurations further comprises successively applying the CP transformation to all possible tiles with the number of data blocks in order of increasing heights starting from the tile specified by an initial width or height.

In some aspects, calculating the tile configurations further comprises successively applying the CP transformation to all possible tiles with the number of data blocks in order of increasing width starting from the tile specified by an initial width or height.

In some aspects, the initial height of the tile is equal to 1. In some aspects, the initial tile width is equal to a width of a stripe where the data were originally stored.

In some aspects, prior to determining the maximum number of the data blocks, the method may determine that at least one intermediate tile width exists between the width of the tile and the desired tile width such that the number of data blocks is divisible by the at least one intermediate tile width. In some aspects, the method may determine at least a second maximum number of data blocks that do not need to be rearranged, and may determine a second tile reconfiguration with the at least one intermediate tile width that does not rearrange the second maximum number of the data blocks of the tile. In this case, determining the maximum number of the data blocks that do not need to rearranged when reconfiguring the tile to the desired tile width is based on the second tile reconfiguration.

In some aspects, all determined tile reconfigurations of the plurality of data blocks are retained in the erasure encoded storage until the tile has been re-striped to the desired tile width, wherein the determined tile reconfigurations comprise a tile size, a current width or height and an initial width or height.

In some aspects, a coordinator node performs re-striping and wherein a centralized metadata service (MDS) determines configurations and delivers node assignments to the coordinator node in special storage mapping messages.

In some aspects, subsequent to re-striping the tile to the desired tile width, the method may send a completion message to the MDS. The MDS may be configured to store (1) an initial tile configuration of the re-striped tile and the width and (2) the second tile reconfiguration of the re-striped tile and the desired tile width. The MDS may be further configured to deliver new mapping messages to all the storage nodes to confirm completion of the re-striping, wherein the storage nodes drop all data and metadata associated with the initial tile configuration of the re-striped tile.

In some aspects, the maximum number of data blocks is determined based on the number of data blocks in the tile and a maximum possible fraction $S_{max}$, wherein $S_{max}(n,m)$ =min(n,m)/max(n,m) and wherein n is the width of the tile and m is the desired tile width.

It should be noted that the methods described above may be implemented in a system comprising a hardware processor. Alternatively, the methods may be implemented using computer executable instructions of a non-transitory computer readable medium.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and exemplarily pointed out in the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

DETAILED DESCRIPTION

Exemplary aspects are described herein in the context of a system, method, and computer program product for optimized re-striping in an erasure encoded storage. Those of ordinary skill in the art will realize that the following description is illustrative only and is not intended to be in any way limiting. Other aspects will readily suggest themselves to those skilled in the art having the benefit of this disclosure. Reference will now be made in detail to implementations of the example aspects as illustrated in the accompanying drawings. The same reference indicators will be used to the extent possible throughout the drawings and the following description to refer to the same or like items.

Figure 1:
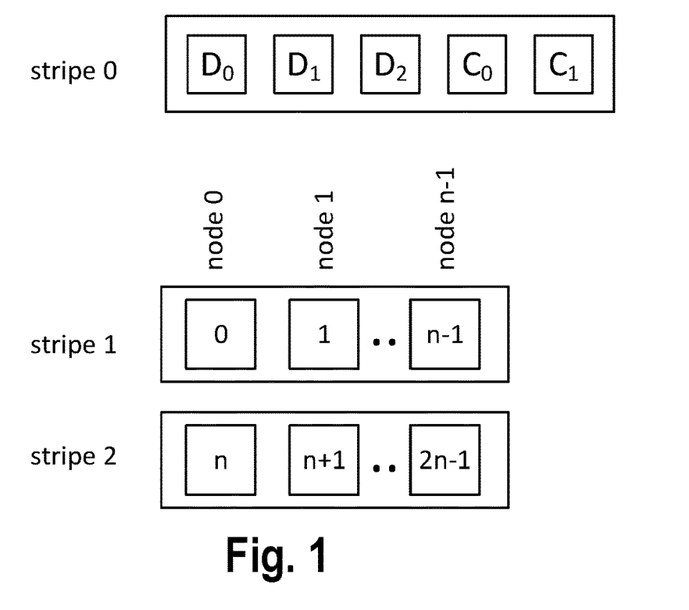
FIG. 1 is a block diagram illustrating example stripes in an erasure encoded storage, according to an exemplary aspect.

FIG. 1 is a block diagram illustrating example stripes in an erasure encoded storage, according to an exemplary aspect. In FIG. 1, the stripe 0 is a set of 3 fixed sized data blocks augmented by 2 checksum blocks. These respective block types are denoted as $D_i$, $C_i$. The checksum blocks are related to data blocks via 2 linear functions $C_i=F_i$ ($D_0$, $D_1 \ldots D_{n-1}$). If for example $D_0$ is corrupted, the values of $D_i$, $D_2$, $C_0$, and $C_1$ can be used to reconstruct $D_0$ by solving the 2 linear equations defined by $F_{1,2}$.

In some aspects, data storage can be comprised of a plurality of stripes. For example, FIG. 1 also features stripe 1 and stripe 2. In the most straightforward implementation, the data blocks may be arranged sequentially (e.g., 0, 1, ..., n−1, n, 2n−1) over the stripes. For simplicity, only the data blocks are depicted in stripe 1 and stripe 2. To distinguish one data block from another a zero based index is utilized for labelling each block. The erasure encoded storage container may be treated as the sequential file with every byte having a unique offset relative to the start of the file. Given such an offset, the data block index may be calculated as the offset divided by the block size (assuming integer division exclusively).

In FIG. 1, the data blocks are grouped to the stripes 0 and 1 with n blocks each. Accordingly, the stripe index equals the data block index divided by n. This sequential arrangement is referred to hereinafter as plain striping. The block index within the stripe is referred to as node index because data blocks having the same node index are typically stored on the same storage node. For plain striping, the node index equals to the block index modulo n.

Figure 2:
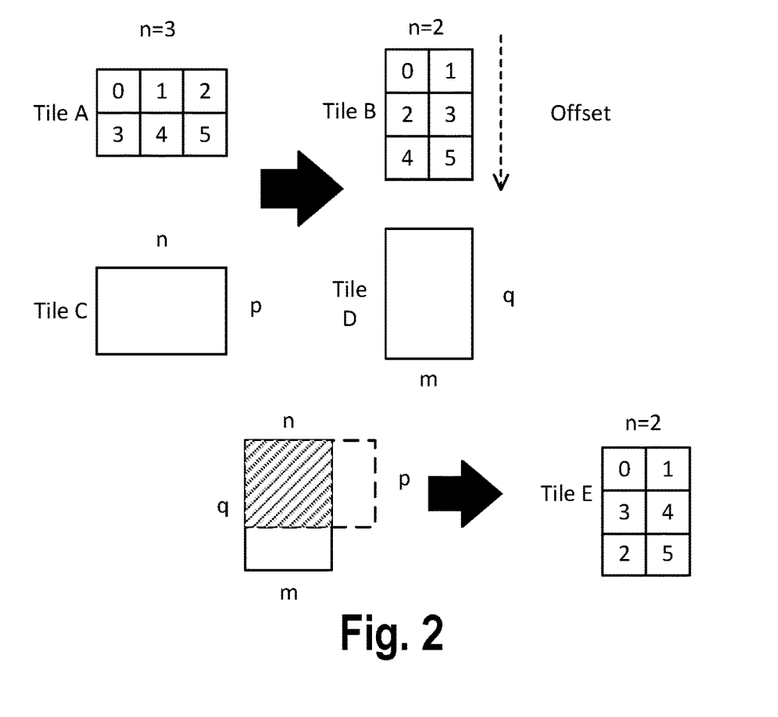
FIG. 2 is a block diagram illustrating re-striping in an erasure encoded storage, according to an exemplary aspect.

FIG. 2 is a block diagram illustrating a method 200 for re-striping in an erasure encoded storage, according to an exemplary aspect. In order to change stripe width n of an existing stripe, some blocks have to be added to or removed from every stripe. The blocks go to and/or come from the other stripes of the same file such that the total number of stripes changes, but the total number of blocks is kept constant. A conventional approach used to move an entire data set to another storage container involves copying all the data to another storage location. This approach is inefficient and may be greatly improved by additions to the storage architecture described below.

In order to be able to restripe a file in-place, the file is split onto fixed sized groups of stripes that we call tiles. Every tile may be re-striped separately from the others. The number of blocks in a tile is known as the tile size. It is convenient to choose tile size taking in mind the set of possible stripe widths that must be supported by the storage. In other words, the tile size should be divisible by each supported stripe width. The result of the division represents the number of stripes that constitutes the tile for the given stripe width. For example, having a tile size of 6, supported stripe widths equal n=1, 2, 3, and 6. Because the stripe width may be considered as the tile width as well, both terms are used interchangeably.

Referring to FIG. 2, the tile size equals 6 and tile A originally has two stripes, each with a tile width of 3. When restriping, tile A becomes tile B. In tile B, the tile size remains at 6, but three stripes are present, each with a tile width of 2. Considering the general examples of tile C and tile D, tile C features p stripes each with width n and tile D features q stripes each with width m. Changing stripe width of tile C from n to m involves rearranging its data blocks from one n*p grid to another m*q grid (where n*p equals m*q, and where both equal the tile size).

A property of the tile transformation (like the one shown on FIG. 2) is the amount of the data blocks that stay at the same node during transformation. We will refer to them as stable blocks. The transformation shown in FIG. 2 has only 2 stable blocks (block 0 and block 1). This means that 4 blocks out of the 6 must be copied to other storage nodes. This amount is 2 times larger than the minimal possible value as will be discussed below.

Consider the re-striping in FIG. 2 from tile width n and height p to tile with width m<n and height q. Both tiles have the same number of blocks such that n*p=m*q. A data block can stay at the same node during such transformation if and only if the data block has a node index less than m in the original tile. This is because there are no more nodes with indexes m and above in the new tile. This means that the maximum possible number of blocks that can stay at the same node during tile transformation is equal to the number of blocks in the area of tiles intersection that is p*m. The maximum possible fraction of such stable blocks with respect to the tile size is m/n or considering arbitrary n and m:

$$S_{max}(n,m) = \min(n,m)/\max(n,m)$$

In FIG. 2, if n=3 and m=2, $S_{max}(2,3)=2/3$. This indicates that 2 of every 3 blocks can be stable. Because 6 data blocks exist, 4 data blocks can be kept in their original position. The stable blocks are depicted in the shaded overlap section. This represents data blocks 0, 1, 3, and 4. Tile E thus depicts an alternate re-striping of tile B, where data blocks 2 and 5 are moved, while the remaining blocks are kept stable.

The movement of data blocks 2 and 5 may be performed in any arbitrary order, but in some aspects it is preferred to keep the order they have in the original tile. The transformation defined in such way possesses an optimal stability property because all stable blocks (e.g., 0, 1, 3, and 4) preserve their stripe assignment (that is they possess even stronger property). In other words, they have the same row, column pair in the old and new tile. Such a transformation is referred to as cut-and-paste (CP) transformation. This transformation is further described in FIG. 3.

Figure 3:
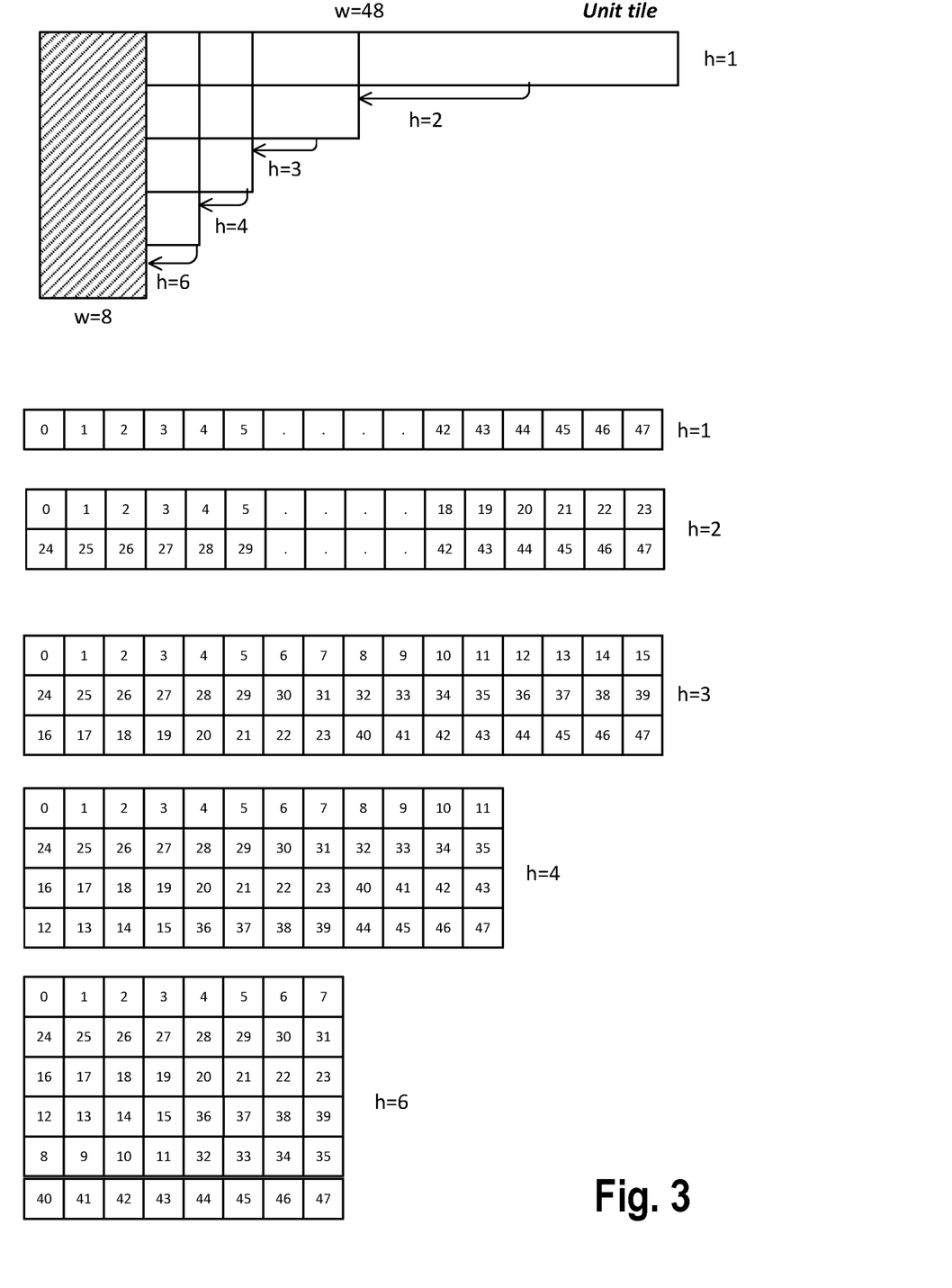
FIG. 3 is a diagram illustrating optimized re-striping in an erasure encoded storage, according to an exemplary aspect.

FIG. 3 is a diagram illustrating a method 300 for optimized re-striping in an erasure encoded storage, according to an exemplary aspect. The present disclosure provides a method to construct the set of tile arrangements for every possible tile width that possesses optimal stability property. That is, the transformation between any two tiles from this set explicitly defined by their block arrangements possesses optimal stability property.

Suppose a data block arrangement for the tile with given width and height as shown on FIG. 3 where the tile of interest is shaded. The tile of interest has height h=6 and width w=8, so the total tile size is 48. The initial tile may be the unit tile with height h=1 and width w=48. Although the data blocks in unit tile can be arranged in an arbitrary fashion, it is preferred that the arrangement of the blocks be in the order of their indexes. CP transformation may be applied to the unit tile to get the tile height next to the height 1 in the ordered list of possible values. CP transformation may then be applied again to the resultant tile yielding the next possible tile height. This procedure may be repeated until the resultant tile is the tile of interest. This process is guaranteed to terminate provided that the required tile height is present in the list of the possible tile height.

Suppose that there exists two tile arrangements built the way just described. The transformation from one of them to another has optimal stability property for the simple reason that it may be defined as the sequence of CP-transformations between adjacent tile heights in list of the possible height values. Consider for example the transformation from tile with height p (e.g., 1) to tile with height q (e.g., 6). It should be noted that if a transformation has the optimal stability property, the same is true for reverse transformation. Accordingly, only the case p<q is to be considered. Consider the set of all possible intermediate tile heights $\{p_i\}i=_{1 \ldots k}$ such that $p<p_i<q$. The transformation from tile with height p (e.g., 1) to the tile with height q (e.g., 6) may be treated as the composition of CP-transforms gradually increasing tile height from p to $p_1$ (1 to 2), from $p_1$ to $p_2$ (2 to 3), and so on throughout the set of intermediate tile height all the way to q (6). The stable blocks fraction of such composition may be calculated as the product of the stable blocks fractions of individual CP-transforms that is:

$$S_{p \to q} = \frac{p}{p_1} * \frac{p_1}{p_2} * \ldots * \frac{p_{k-1}}{p_k} * \frac{p_k}{q} = \frac{p}{q} = S_{max}(p,q)$$

Therefore, the set of tiles obtained by sequentially applying CP-transformation to unit tile throughout the sorted set of all possible tile heights indeed possesses the optimal stability property. The transformation between any two tiles from this set keeps the maximum possible number of data blocks at their original nodes. Even more strict statement is true for that set of tiles—the transformations between them keep stripe assignments of the stable blocks unchanged.

In FIG. 3, the unit tile comprises 48 data blocks. These data blocks together from a piece of data (e.g., a file). Each data block is stored on a different storage node. Accordingly, each column of the unit tile represents a respective storage node. When the tile arrangement is re-striped from the unit tile to the tile reconfiguration (e.g., h=6), only eight storage nodes are used to store data blocks and each storage node holds 6 data blocks. It should be noted that a goal of the re-striping is to keep as many data blocks as possible in their original storage node. Suppose that initially the height of a tile is 3 (e.g., the tile arrangement depicted as h=3). A user may wish to transform tile arrangement to h=4. This would in turn reduce the amount of storage nodes from 16 to 12. As seen in FIG. 3, the methods allow for 36 of the 48 data blocks to remain at the original storage node. For example, the first column may represent a first storage node. When the tile height is 3, the first storage node holds data blocks 0, 24, and 16. When the tile height is 4, the first storage node holds data blocks 0, 24, 16, and 12 (i.e., retains the 75% of its data blocks).

In order to implement optimized tile restriping, the storage should be able to associate with data blocks and save persistently some small amount of metadata (e.g., the data block index and the current stripe width). During tile transformation, the original version of the tile including the checksums should be kept intact until the new version is built completely. Otherwise, the recovery in case of the failure of some subset of nodes may become impossible. This means that the storage should support storing at least two versions of the same tile at a time (e.g., retain h=3 while generating h=4 in reference to FIG. 3). The implementation may perform tile transformation one at a time to avoid excessive storage overhead. The implementation may disable updates to the tile data until transformation reaches completion. Referring to the example previously discussed, if an original tile height of 3 is being changed to a tile height of 4, the storage node originally holding data block 12 transmits data block 12 to the first storage node. Likewise the storage node holding data block 13 transmits data block 13 to the second storage node (e.g., holding data blocks 1, 25, and 17). To prevent data loss, the source storage nodes may continue to hold their data blocks until all data blocks have been received by their intended recipient storage nodes. Thus, at a given time during the re-striping, all storage nodes collectively support two versions of the same tile with different heights/widths.

The implementation may use the dedicated storage node as the tile transformation coordinator. Typically, the set of storage nodes arranged for the file or some part of it is stored in the centralized meta-data service (also known as MDS). The MDS is used to deliver nodes assignment information in special storage mapping messages over a network (e.g., the Internet). During transformation the MDS can keep the set of nodes including old and new nodes as well as the old and new stripe width. Upon transformation completion, the coordinator node may send completion message to MDS. Upon receiving completion message, the MDS may commit the new storage node set and deliver new mapping messages to all nodes to confirm transformation completion. Upon receiving such mapping message, every storage node will drop all data and metadata associated with the old tile arrangement that is no longer used.

Special care should be taken to handle recovery of the tile while its transformation is in progress. One possible strategy is to drop new uncompleted tile state any time there is a need to perform data recovery. This will not be a problem provided that tiles are transformed one at a time. Another possible strategy is to consider transformation as the special case of replication. Thus, the transformation can be performed even in case there is an incomplete set of nodes in the old tile. This means that the data blocks in the new tile will be either directly copied from the source node if available or reconstructed using checksum blocks.

The amount of data stored in the tile does not have to be equal to the tile capacity (i.e., the block size multiplied by the tile size). In case there is not enough data to fill all data blocks, some of them will be left empty. The implementation may mark empty data blocks in the metadata to avoid storing them and exclude them from the checksums calculation. Each checksum block may have an associated bitmap of the data blocks used for its calculation. It should be noted that using fewer data blocks for checksum calculation than the stripe width n reduces storage efficiency. Fortunately, the tiles built using the procedure described above have one useful property. The first stripe of the tile always contains the first n data blocks in the order of their offsets. So in case the amount of non-empty data blocks does not exceed n, they occupy only the first stripe of the tile minimizing the number of incomplete stripes.

The implementation may still benefit from having plain sequential block arrangement for the entire tile. The alternative tile blocks arrangement scheme is possible that guarantee this property in case the tile width is not changed. To realize such tile blocks arrangement scheme, the implementation may keep the pair of initial and current tile width for the file (or some part of the file). The initial tile width is fixed at the time of the file creation. The current tile width is set equal to the initial one at the file creation but may be changed afterwards. In case the current tile width equals to the initial one, the blocks are arranged to the tile in the order of their indexes. In case the current tile width differs from the initial one, the blocks arrangement is calculated by successively applying CP-transformation as described above, but starting from the tile with initial width and plain sequential blocks arrangement instead of the unit tile.

Figure 4:
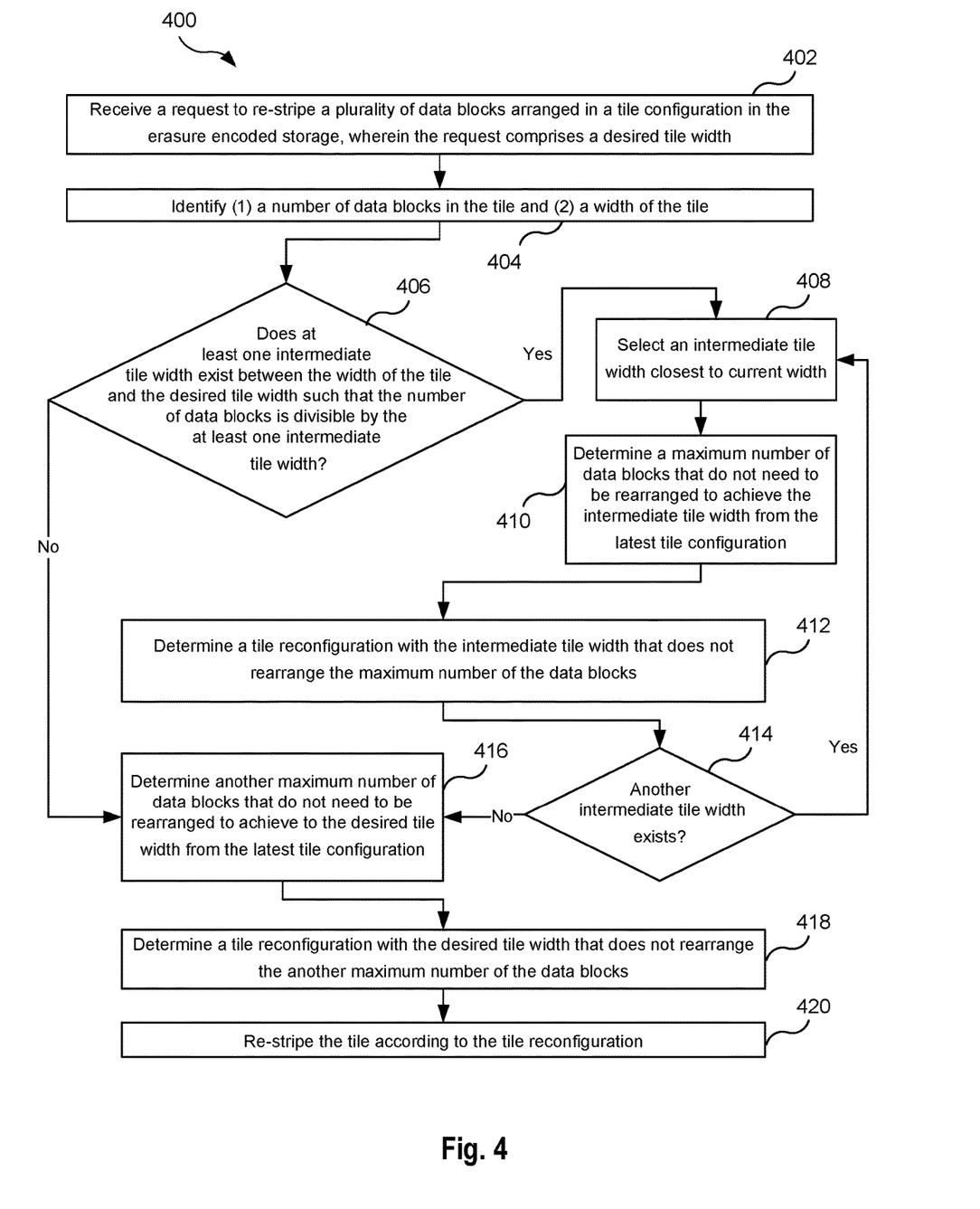
FIG. 4 is a flowchart illustrating a method for optimized re-striping in an erasure encoded storage according to an exemplary aspect.

FIG. 4 is a flowchart illustrating a method 400 for optimized re-striping in an erasure encoded storage, according to an exemplary aspect. At 402, a coordinator node receives a request (e.g., from a user) to re-stripe a plurality of data blocks arranged in a tile configuration in the erasure encoded storage, wherein the request comprises a desired tile width. For example, an initial tile configuration may be the unit tile depicted in FIG. 3. The desired tile width may be 8. Responsive to the request, at 404, the coordinator node identifies (1) a number of data blocks in the tile and (2) a width of the tile. Referring back to FIG. 3, the unit tile comprises 48 data blocks and the width of the tile is 48.

At 406, the coordinator node determines whether at least one intermediate tile width exists between the width of the tile and the desired tile width such that the number of data blocks is divisible by the at least one intermediate tile width. For example, a set of intermediate tile widths may be determined by identifying each integer between 8 and 48 that the number of data blocks (i.e., 48) is divisible by. In this example, the set of intermediate tile widths is {24, 16, 12} in descending order.

In response to determining that the at least one intermediate tile width exists, at 408, the coordinator node selects an intermediate tile width closest to the current width (e.g., 48). For example, the largest width in the set is selected (e.g., 24) because it is closest to the current width. At 410, the coordinator node determines a maximum number of data blocks that do not need to be rearranged to achieve the intermediate tile width from the latest tile configuration. For example, the minimum stable fraction calculation is performed revealing that 24 data blocks do not need to rearranged when changing the tile configuration from a width of 48 to a width of 24.

At 412, the coordinator node determines (e.g., using CP transformation) a tile reconfiguration with the intermediate tile width that does not rearrange the maximum number of the data blocks. This tile configuration is shown in FIG. 3 (the tile with h=2). At 414, the coordinator node determines whether another intermediate tile width exists in the set of intermediate tile widths. In response to determining that another intermediate tile width exists (e.g., 16), the coordinator node returns to 408 where an intermediate tile width of 16 is selected. The loop between 408 and 414 continues again whether another tile reconfiguration is determined to reconfigure the tile with width 24 to a tile with width 16. In this particular example, at 414, the coordinator node again returns to 408, where an intermediate tile width of 12 is selected.

At 416, the coordinator node determines another maximum number of data blocks that do not need to be rearranged to achieve to the desired tile width from the latest tile configuration. After having iteratively calculated the tile configuration in accordance with the intermediate tile widths, the last reconfiguration is determined at 418. In this case, the reconfiguration happens from a tile of width 12 to a tile of the desired width 8. Again, the tile reconfiguration is determined such that the another maximum number of the data blocks from the latest tile configuration do not have to be rearranged.

Referring back to 406, it is possible that no intermediate tile widths exist. For example, the desired tile width may be 24 and the initial tile width may be 48. Because no integer between 24 and 48 exists that 48 is divisible by, the coordinator node may proceed from 406 to 416. At 416, the latest tile configuration will simply be the first tile configuration. Thus, the another maximum number of data blocks will be 24. At 418, the tile reconfiguration will be determined with the desired tile width, wherein the tile reconfiguration does not rearrange the another maximum number of the data blocks. At 420, the coordinator node re-stripes the tile according to the tile reconfiguration (whether iteratively determined between steps 406 and 418 or solely over steps 404, 416, and 418). More specifically, the coordinator node transmits instructions to the storage nodes storing the data blocks to be moved in a given tile reconfiguration. The instructions may identify which data blocks to transmit and the addresses of the destination storage nodes.

Figure 5:
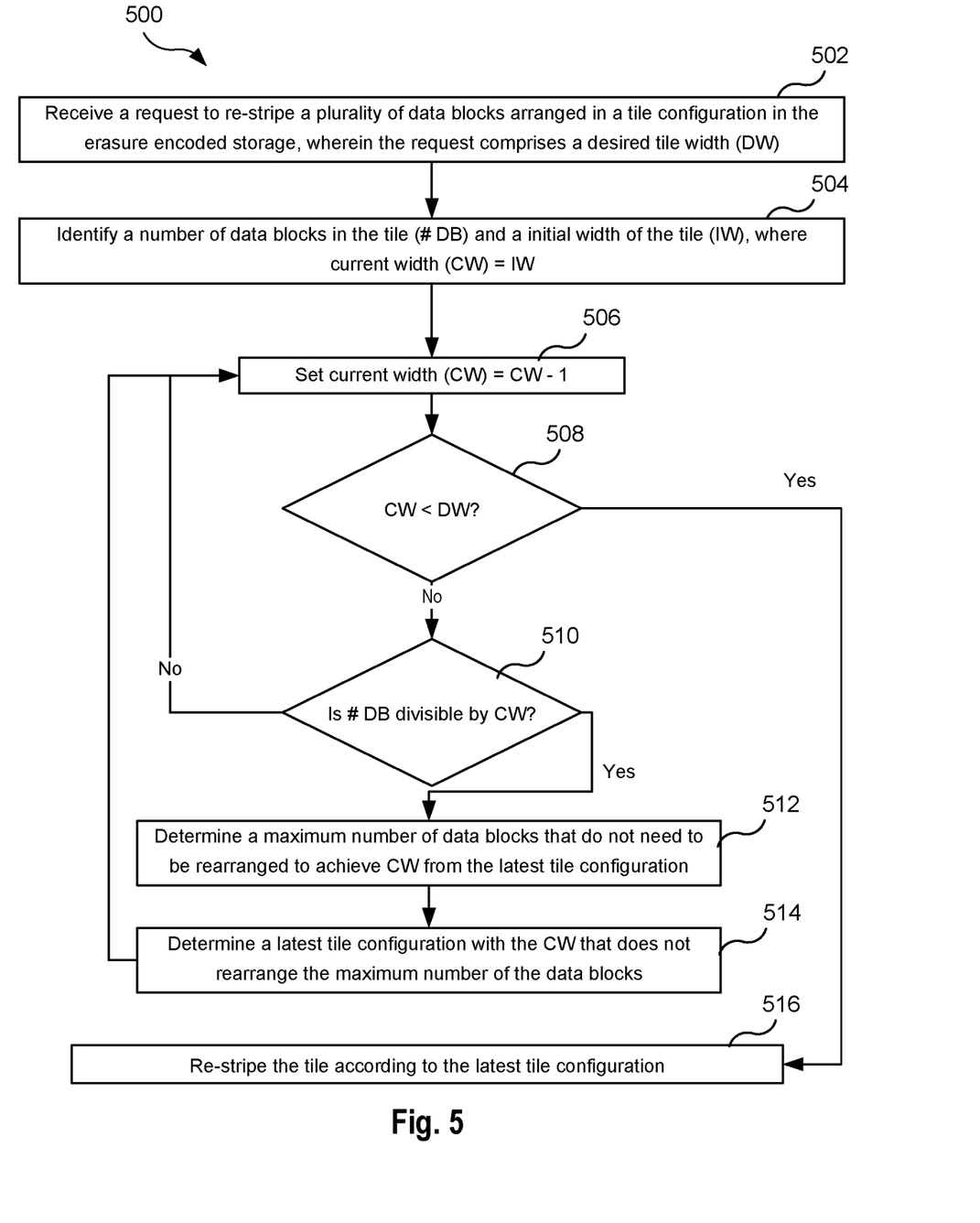
FIG. 5 is a flowchart illustrating a method for optimized re-striping in an erasure encoded storage by decrementing tile width according to an exemplary aspect.

FIG. 5 is a flowchart illustrating method 500 for optimized re-striping in an erasure encoded storage by decrementing tile width according to an exemplary aspect. At 502, a coordinator node receives a request to re-stripe a plurality of data blocks arranged in a tile configuration in the erasure encoded storage, wherein the request comprises a desired tile width (DW). For example, an initial tile configuration may be the unit tile depicted in FIG. 3. The desired tile width (DW) may be 8. Responsive to the request, at 504, the coordinator node identifies a number of data blocks in the tile (#DB) and an initial width of the tile (IW). Referring back to FIG. 3, the unit tile comprises 48 data blocks and the width of the tile is 48. The current width is set to the initial width.

At 506, the coordinator node decrements current width by 1. For example, the current width is set to 47. At 508, the coordinator node determines whether the current width is less than the desired width. In response to determining that it is not, the coordinator node advances to 510, where it is determined whether the current width is divisible by the number of data blocks. In this case, because 48 is not divisible by 47, the coordinator node returns to 506 and current width is decremented again. The loop between 506 and 510 continues until the current width is equal to a value that the number of data blocks is divisible by. For example, at after multiple decrements, the current width decrements to 24. At 508, the coordinator node determines that 48 is divisible by 24.

In response to determining that the number of data blocks is divisible by the current width, the coordinator node advances to 512, where the coordinator node determines a maximum number of data blocks that do not need to be rearranged to achieve the current width from the latest tile configuration. In this example, the latest tile configuration is the initial tile configuration (e.g., the unit tile). Using the maximum possible fraction, the coordinator node may determine that 24 data blocks do not have to be rearranged. At 514, the coordinator node determines a latest tile configuration with the CW that does not rearrange the maximum number of the data blocks. For example, the coordinator node may determine a tile configuration with two rows, each with 24 data blocks.

From 514, the coordinator node returns to 506, where the current width is decremented again. In the overarching example, the loop between 506 and 510 may continue until the current width becomes 16. In response to determining that 48 is divisible by 16, the coordinator node advances to 512 and 514 and determines a new latest tile configuration relative to the previous latest tile configuration. For example, the coordinator node may determine a reconfiguration that changes the 24 by 2 tile to a 16 by 3 tile. It should be noted that the coordinator node does not actually re-stripe the tile until 516. To arrive at 516, the current width needs to be less than the desired width. For example, after several decrements, the current width may be 7, which is less than 8. The latest tile configuration at that point comprises the desired width of 8. Accordingly, the coordinator node may exit the loop and at 516, re-stripe the tile according to the latest tile configuration (e.g., 6 by 8).

Figure 6:
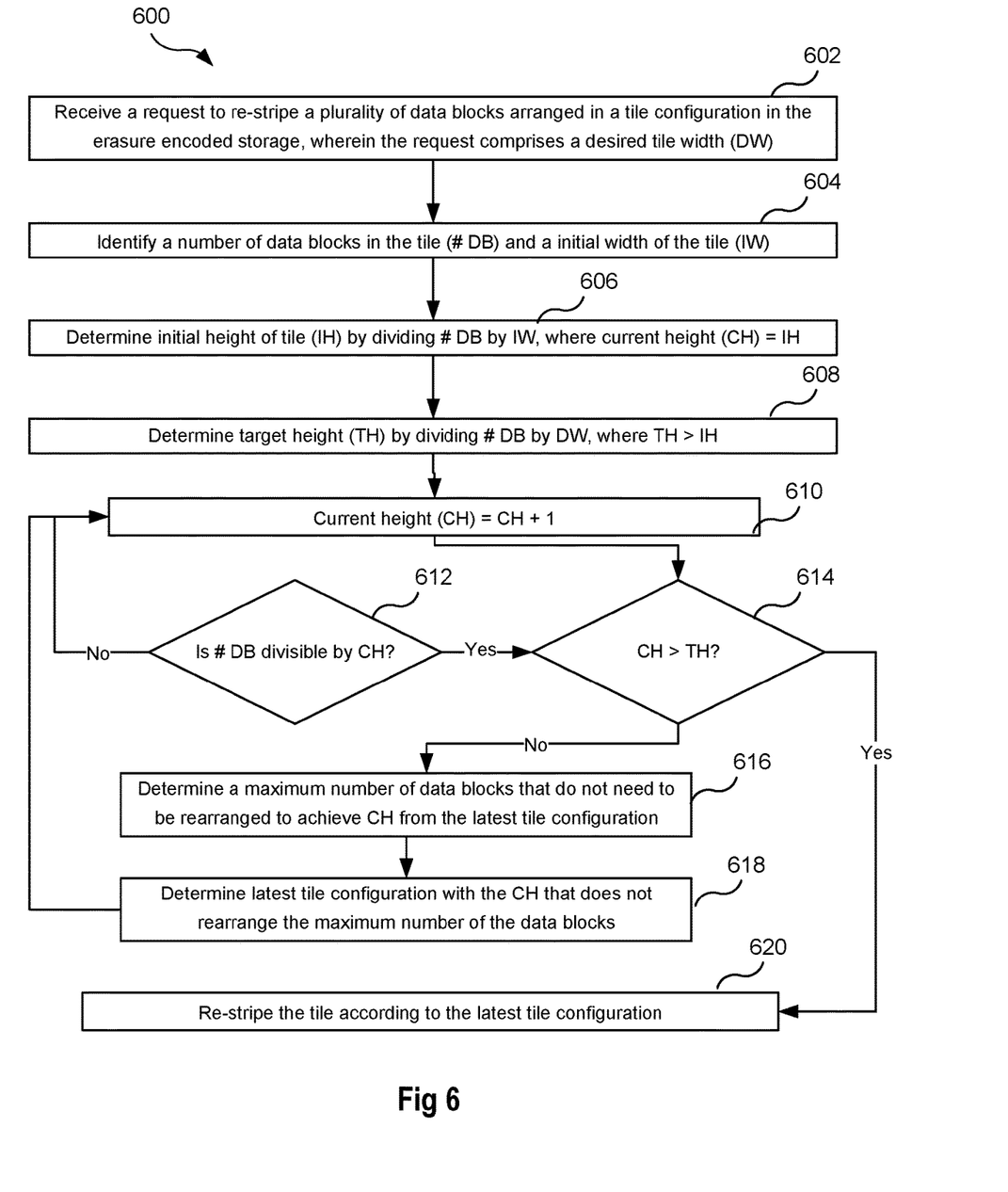
FIG. 6 is a flowchart illustrating a method for optimized re-striping in an erasure encoded storage by incrementing tile height according to an exemplary aspect.

FIG. 6 is a flowchart illustrating method 600 for optimized re-striping in an erasure encoded storage by incrementing tile height according to an exemplary aspect. At 602, a coordinator node receives a request to re-stripe a plurality of data blocks arranged in a tile configuration in the erasure encoded storage, wherein the request comprises a desired tile width (DW). At 604, the coordinator node identifies a number of data blocks in the tile (#DB) and an initial width of the tile (IW). At 606, the coordinator node determines initial height of tile (IH) by dividing #DB by IW, where current height (CH)=IH. Referring to the overarching example in which a until tile of 48 data blocks is to be transformed to a tile with a desired width of 8, the coordinator node may approach the tile re-striping from the perspective of height. The initial width of 48 indicates that the initial height 1, which is set to the current height.

At 608, the coordinator node determines a target height (TH) by dividing the number of data blocks (#DB) by the desired width. It should be noted that the target height is greater than the initial height in this particular method. For example, the target height is 6 in this example (i.e., 48/8).

At 610, the current height is incremented by 1 (e.g., is now 2). At 612, the coordinator node determines whether the number of data blocks is divisible by the current height. In this example, 48 is divisibly by 2. In response to determining the divisibility, the coordinator node advances to 614, where it is determined whether the current height is greater than the target height. In this example, 2 is less than 6, and thus, the coordinator node advances to 616.

At 616, the coordinator node determines a maximum number of data blocks that do not need to be rearranged to achieve CH from the latest tile configuration. This determination is again performed using the maximum possible fraction technique. At 618, the coordinator node determines a latest tile configuration with the CH that does not rearrange the maximum number of the data blocks. For example, the coordinator node determines a tile that is 24 by 2.

From 618, the coordinator node returns to 610, where the current height is incremented again. The loop between 610 and 618 continues for each height that satisfies the divisibility criteria and is less than or equal to the target height. For example, a tile configuration is iteratively determined for heights 2, 3, 4, and 6. When the current height is greater than the target height, the loop is broken and the coordinator node ends at 620, where the coordinator node re-stripes the tile according to the latest tile configuration.

Figure 7:
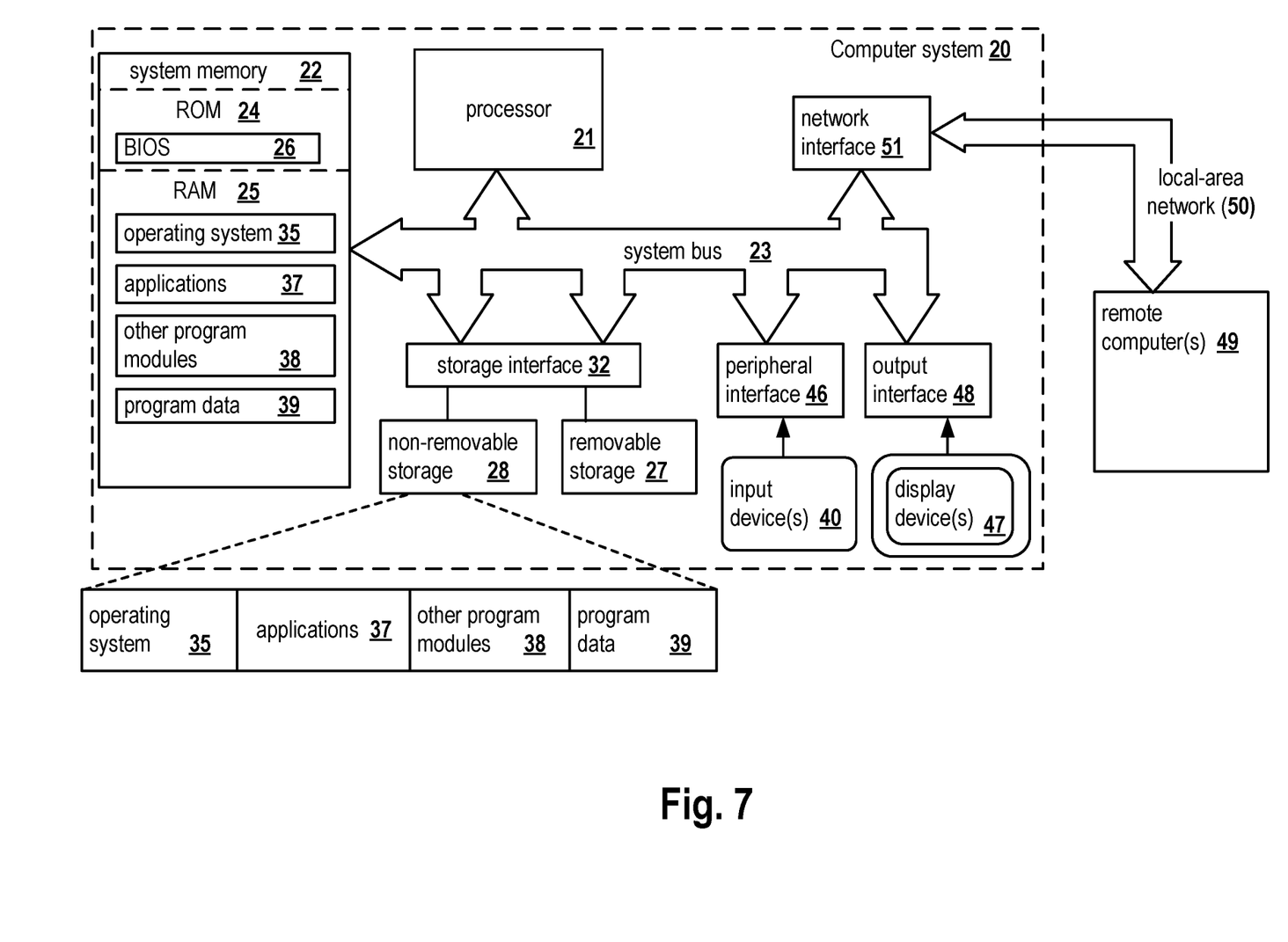
FIG. 7 is a block diagram of a computer system on which the disclosed system and method can be implemented according to an exemplary aspect.

FIG. 7 is a block diagram illustrating a computer system 20 on which aspects of systems and methods for optimized re-striping in an erasure encoded storage may be implemented in accordance with an exemplary aspect. It should be noted that the computer system 20 can correspond to a coordinator node, a storage node, and the MDS, for example, described earlier. The computer system 20 can be in the form of multiple computing devices, or in the form of a single computing device, for example, a desktop computer, a notebook computer, a laptop computer, a mobile computing device, a smart phone, a tablet computer, a server, a mainframe, an embedded device, and other forms of computing devices.

As shown, the computer system 20 includes a central processing unit (CPU) 21, a system memory 22, and a system bus 23 connecting the various system components, including the memory associated with the central processing unit 21. The system bus 23 may comprise a bus memory or bus memory controller, a peripheral bus, and a local bus that is able to interact with any other bus architecture. Examples of the buses may include PCI, ISA, PCI-Express, HyperTransport™, InfiniBand™, Serial ATA, I²C, and other suitable interconnects. The central processing unit 21 (also referred to as a processor) can include a single or multiple sets of processors having single or multiple cores. The processor 21 may execute one or more computer-executable code implementing the techniques of the present disclosure.

The system memory 22 may be any memory for storing data used herein and/or computer programs that are executable by the processor 21. The system memory 22 may include volatile memory such as a random access memory (RAM) 25 and non-volatile memory such as a read only memory (ROM) 24, flash memory, etc., or any combination thereof. The basic input/output system (BIOS) 26 may store the basic procedures for transfer of information between elements of the computer system 20, such as those at the time of loading the operating system with the use of the ROM 24.

The computer system 20 may include one or more storage devices such as one or more removable storage devices 27, one or more non-removable storage devices 28, or a combination thereof. The one or more removable storage devices 27 and non-removable storage devices 28 are connected to the system bus 23 via a storage interface 32. In an aspect, the storage devices and the corresponding computer-readable storage media are power-independent modules for the storage of computer instructions, data structures, program modules, and other data of the computer system 20. The system memory 22, removable storage devices 27, and non-removable storage devices 28 may use a variety of computer-readable storage media. Examples of computer-readable storage media include machine memory such as cache, static random access memory (SRAM), dynamic random access memory (DRAM), zero capacitor RAM, twin transistor RAM, enhanced dynamic random access memory (eDRAM), extended data output random access memory (EDO RAM), double data rate random access memory (DDR RAM), electrically erasable programmable read-only memory (EEPROM), NRAM, resistive random access memory (RRAM), silicon-oxide-nitride-silicon (SONOS) based memory, phase-change random access memory (PRAM); flash memory or other memory technology such as in solid state drives (SSDs) or flash drives; magnetic cassettes, magnetic tape, and magnetic disk storage such as in hard disk drives or floppy disks; optical storage such as in compact disks (CD-ROM) or digital versatile disks (DVDs); and any other medium which may be used to store the desired data and which can be accessed by the computer system 20.

The system memory 22, removable storage devices 27, and non-removable storage devices 28 of the computer system 20 may be used to store an operating system 35, additional program applications 37, other program modules 38, and program data 39. The computer system 20 may include a peripheral interface 46 for communicating data from input devices 40, such as a keyboard, mouse, stylus, game controller, voice input device, touch input device, or other peripheral devices, such as a printer or scanner via one or more I/O ports, such as a serial port, a parallel port, a universal serial bus (USB), or other peripheral interface. A display device 47 such as one or more monitors, projectors, or integrated display, may also be connected to the system bus 23 across an output interface 48, such as a video adapter. In addition to the display devices 47, the computer system 20 may be equipped with other peripheral output devices (not shown), such as loudspeakers and other audiovisual devices The computer system 20 may operate in a network environment, using a network connection to one or more remote computers 49. The remote computer (or computers) 49 may be local computer workstations or servers comprising most or all of the aforementioned elements in describing the nature of a computer system 20. Other devices may also be present in the computer network, such as, but not limited to, routers, network stations, peer devices or other network nodes. The computer system 20 may include one or more network interfaces 51 or network adapters for communicating with the remote computers 49 via one or more networks such as a local-area computer network (LAN) 50, a wide-area computer network (WAN), an intranet, and the Internet. Examples of the network interface 51 may include an Ethernet interface, a Frame Relay interface, SONET interface, and wireless interfaces.

Aspects of the present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store program code in the form of instructions or data structures that can be accessed by a processor of a computing device, such as the computing system 20. The computer readable storage medium may be an electronic storage device, a magnetic storage device, an optical storage device, an electromagnetic storage device, a semiconductor storage device, or any suitable combination thereof. By way of example, such computer-readable storage medium can comprise a random access memory (RAM), a read-only memory (ROM), EEPROM, a portable compact disc read-only memory (CD-ROM), a digital versatile disk (DVD), flash memory, a hard disk, a portable computer diskette, a memory stick, a floppy disk, or even a mechanically encoded device such as punch-cards or raised structures in a groove having instructions recorded thereon. As used herein, a computer readable storage medium is not to be construed as being transitory signals per se, such as radio waves or other freely propagating electromagnetic waves, electromagnetic waves propagating through a waveguide or transmission media, or electrical signals transmitted through a wire.

Computer readable program instructions described herein can be downloaded to respective computing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network interface in each computing device receives computer readable program instructions from the network and forwards the computer readable program instructions for storage in a computer readable storage medium within the respective computing device.

Computer readable program instructions for carrying out operations of the present disclosure may be assembly instructions, instruction-set-architecture (ISA) instructions, machine instructions, machine dependent instructions, microcode, firmware instructions, state-setting data, or either source code or object code written in any combination of one or more programming languages, including an object oriented programming language, and conventional procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or WAN, or the connection may be made to an external computer (for example, through the Internet). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

In various aspects, the systems and methods described in the present disclosure can be addressed in terms of modules. The term "module" as used herein refers to a real-world device, component, or arrangement of components implemented using hardware, such as by an application specific integrated circuit (ASIC) or FPGA, for example, or as a combination of hardware and software, such as by a microprocessor system and a set of instructions to implement the module's functionality, which (while being executed) transform the microprocessor system into a special-purpose device. A module may also be implemented as a combination of the two, with certain functions facilitated by hardware alone, and other functions facilitated by a combination of hardware and software. In certain implementations, at least a portion, and in some cases, all, of a module may be executed on the processor of a computer system (such as the one described in greater detail in FIG. 6, above). Accordingly, each module may be realized in a variety of suitable configurations, and should not be limited to any particular implementation exemplified herein.

In the interest of clarity, not all of the routine features of the aspects are disclosed herein. It would be appreciated that in the development of any actual implementation of the present disclosure, numerous implementation-specific decisions must be made in order to achieve the developer's specific goals, and these specific goals will vary for different implementations and different developers. It is understood that such a development effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by the skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

The various aspects disclosed herein encompass present and future known equivalents to the known modules referred to herein by way of illustration. Moreover, while aspects and applications have been shown and described, it would be apparent to those skilled in the art having the benefit of this disclosure that many more modifications than mentioned above are possible without departing from the inventive concepts disclosed herein.

What is claimed is:

1. A computer-implemented method for optimized re-striping in an erasure encoded storage, the method comprising:
   receiving a request to re-stripe a plurality of data blocks arranged as a tile in the erasure encoded storage, wherein the request comprises a desired tile width;
   identifying (1) a number of data blocks in the tile and (2) a width of the tile;
   determining a maximum number of data blocks that do not need to be rearranged when reconfiguring the tile to the desired tile width;
   determining a tile reconfiguration with the desired tile width that does not rearrange the maximum number of the data blocks of the tile by calculating tile configurations for all possible tile widths that the number of data blocks is divisible by; and
   re-striping the tile in accordance with the tile reconfiguration.

2. The method of claim 1, wherein applying CP transformation comprises:
   determining a respective maximum number of data blocks that do not need to be rearranged when reconfiguring a given tile to a given tile width and determining a respective tile reconfiguration with the given tile width that does not rearrange the respective maximum number of the data blocks of the given tile.

3. The method of claim 2, wherein calculating the tile configurations further comprises successively applying the CP transformation to all possible tiles with the number of data blocks in order of increasing heights starting from the tile specified by an initial width or height.

4. The method of claim 2, wherein calculating the tile configurations further comprises successively applying the CP transformation to all possible tiles with the number of data blocks in order of increasing width starting from the tile specified by an initial width or height.

5. The method of claim 4, wherein the initial height of the tile is equal to 1.

6. The method of claim 4, wherein the initial tile width is equal to a width of a stripe where the data were originally stored.

7. The method of claim 1, further comprising:
   prior to determining the maximum number of the data blocks:
   determining that at least one intermediate tile width exists between the width of the tile and the desired tile width such that the number of data blocks is divisible by the at least one intermediate tile width;
   determining at least a second maximum number of data blocks that do not need to be rearranged; and
   determining a second tile reconfiguration with the at least one intermediate tile width that does not rearrange the second maximum number of the data blocks of the tile, wherein determining the maximum number of the data blocks that do not to rearranged when reconfiguring the tile to the desired tile width is based on the second tile reconfiguration.

8. The method of claim 7, wherein all determined tile reconfigurations of the plurality of data blocks are retained in the erasure encoded storage until the tile has been re-striped to the desired tile width, wherein the determined tile reconfigurations comprise a tile size, a current width or height and an initial width or height.

9. The method of claim 8, wherein a coordinator node performs re-striping and wherein a centralized metadata service (MDS) determines configurations and delivers node assignments to the coordinator node in special storage mapping messages.

10. The method of claim 9, further comprising:
    subsequent to re-striping the tile to the desired tile width, sending a completion message to the MDS, wherein the MDS is configured to:
    store (1) an initial tile configuration of the re-striped tile and the width and (2) the second tile reconfiguration of the re-striped tile and the desired tile width; and deliver new mapping messages to all the storage nodes to confirm completion of the re-striping, wherein the storage nodes drop all data and metadata associated with the initial tile configuration of the re-striped tile.

11. The method of claim 1, wherein the maximum number of data blocks is determined based on the number of data blocks in the tile and a maximum possible fraction $S_{max}$, wherein $$S_{max}(n,m) = \min(n,m)/\max(n,m)$$

and wherein n is the width of the tile and m is the desired tile width.

12. A system for optimized re-striping in an erasure encoded storage, the system comprising:
a hardware processor configured to:
receive a request to re-stripe a plurality of data blocks arranged as a tile in the erasure encoded storage, wherein the request comprises a desired tile width;
identify (1) a number of data blocks in the tile and (2) a width of the tile;
determine a maximum number of data blocks that do not need to be rearranged when reconfiguring the tile to the desired tile width;
determine a tile reconfiguration with the desired tile width that does not rearrange the maximum number of the data blocks of the tile by calculating tile configurations for all possible tile widths that the number of data blocks is divisible by; and
re-stripe the tile in accordance with the tile reconfiguration.

13. The system of claim 12, wherein the hardware processor is further configured to apply CP transformation by:
determining a respective maximum number of data blocks that do not need to be rearranged when reconfiguring a given tile to a given tile width and determining a respective tile reconfiguration with the given tile width that does not rearrange the respective maximum number of the data blocks of the given tile.

14. The system of claim 13, wherein the hardware processor is further configured to calculate the tile configurations by successively applying the CP transformation to all possible tiles with the number of data blocks in order of increasing heights starting from the tile specified by an initial width or height.

15. The system of claim 13, wherein the hardware processor is further configured to calculate the tile configurations by successively applying the CP transformation to all possible tiles with the number of data blocks in order of increasing width starting from the tile specified by an initial width or height.

16. The system of claim 15, wherein the initial height of the tile is equal to 1.

17. The system of claim 15, wherein the initial tile width is equal to a width of a stripe where the data were originally stored.

18. A non-transitory computer readable medium storing thereon computer executable instructions for optimized re-striping in an erasure encoded storage, including instructions for:
receiving a request to re-stripe a plurality of data blocks arranged as a tile in the erasure encoded storage, wherein the request comprises a desired tile width;
identifying (1) a number of data blocks in the tile and (2) a width of the tile;
determining a maximum number of data blocks that do not need to be rearranged when reconfiguring the tile to the desired tile width;
determining a tile reconfiguration with the desired tile width that does not rearrange the maximum number of the data blocks of the tile by calculating tile configurations for all possible tile widths that the number of data blocks is divisible by; and
re-striping the tile in accordance with the tile reconfiguration.

* * * * *